(12) United States Patent
Sata et al.

(10) Patent No.: US 7,977,609 B2
(45) Date of Patent: Jul. 12, 2011

(54) TEMPERATURE MEASURING DEVICE USING OSCILLATING FREQUENCY SIGNALS

(75) Inventors: Nobuyuki Sata, Kumamoto (JP);
Takahiro Kitano, Kumamoto (JP);
Tetsuo Fukuoka, Koshi (JP); Toshiyuki Matsumoto, Sanda (JP); Tomohide Minami, Nishinomiya (JP)

(73) Assignee: Tokyo Electron Limited (JP)

( * ) Notice: Subject to any disclaimer, the term of this patent is extended or adjusted under 35 U.S.C. 154(b) by 1176 days.

(21) Appl. No.: 11/642,827

(22) Filed: Dec. 21, 2006

(65) Prior Publication Data
US 2007/0170170 A1 Jul. 26, 2007

(30) Foreign Application Priority Data

Dec. 22, 2005 (JP) .................... 2005-370810
Dec. 22, 2005 (JP) .................... 2005-370811

(51) Int. Cl.
*H05B 1/02* (2006.01)
(52) U.S. Cl. ... 219/497; 219/482; 219/486; 156/345.27; 392/416
(58) Field of Classification Search .................. 219/494, 219/483–487, 497, 499, 505, 492; 118/724, 118/725; 156/345.27, 345.24; 392/416–418
See application file for complete search history.

(56) References Cited

U.S. PATENT DOCUMENTS

| | | | | |
|---|---|---|---|---|
| 3,586,830 | A | * | 6/1971 | Leitner et al. ............... 219/501 |
| 3,637,984 | A | * | 1/1972 | Irvine ......................... 219/471 |
| 7,523,889 | B2 | * | 4/2009 | Bourjac et al. ........... 244/134 D |

FOREIGN PATENT DOCUMENTS

| | | |
|---|---|---|
| JP | 2002-124457 | 4/2002 |
| JP | 2004-150860 | 5/2004 |

* cited by examiner

*Primary Examiner* — Mark H Paschall
(74) *Attorney, Agent, or Firm* — Finnegan, Henderson, Farabow, Garrett & Dunner, LLP

(57) ABSTRACT

This invention provides a wafer-type temperature sensor capable of eliminating the need for an A/D converter, adapting itself to automation and improving the heat resistance to measure temperature distribution of the upper surface of a wafer, a temperature measuring device using the sensor, a thermal processor having a temperature measurement function and a temperature measurement method. The wafer-type temperature sensor comprises a wafer and a plurality of temperature sensors arranged in regions which are formed by segmenting the upper surface of the wafer into a plurality of regions. Each of the temperature sensors includes an oscillation circuit for oscillating a frequency signal corresponding to the temperature of its own region within a frequency band that is different for every region in response to input of power supply voltage.

8 Claims, 13 Drawing Sheets

TEMPERATURE MEASURING DEVICE USING OSCILLATING FREQUENCY SIGNALS

BACKGROUND OF THE INVENTION

1. Field of the Invention

This invention relates to a temperature measuring device, a thermal processor having a temperature measurement function and a temperature measurement method, and for example, to a device and method for measuring temperature of a heating plate for use in heating wafers.

2. Description of Background Art

In a photolithography process during the manufacture of semiconductor devices, various thermal treatments, including a heat treatment (pre-bake) which is performed after the application of resist solution onto a surface of a semiconductor wafer (hereinafter referred to as "wafer"), a heat treatment (post-exposure-bake) which is performed after exposing patterns, and a cooling treatment which is performed after each heat treatment, are carried out by, for instance, a heating/cooling system capable of maintaining the wafer at a predetermined temperature.

FIG. 15 is a vertical cross-sectional view of a conventional heating/cooling system 60, while FIG. 16 is a transverse sectional view taken along lines A-A of FIG. 15.

FIG. 15 shows that a heating/cooling system 60 has an enclosure 90 including therein a cooling plate 61 for use in cooling wafers and a heating plate 62 for use in heating wafers juxtaposed to the cooling plate 61. The cooling plate 61 and heating plate 62 are discs with a certain thickness. The cooling plate 61 incorporates some devices such as a Peltier device (not shown) for cooling the cooling plate 61 to a predetermined temperature.

Under the cooling plate 61 provided are elevator pins 63 for supporting and moving up and down the wafer to mount the wafer on the cooling plate 61. These elevator pins 63, which can be moved upward and downward by a vertical drive mechanism 64, are configured to penetrate the cooling plate 61 from the bottom so as to protrude through the upper surface of the cooling plate 61.

On the other hand, the heating plate 62 incorporates a heater 65 and a heating-plate temperature sensor 62a. The temperature of the heating plate 62 is maintained at a preset temperature by a controller 66 that controls the heating value of the heater 65 based on the temperature sensed by the heating-plate temperature sensor 62a. As with the cooling plate 61, elevator pins 67 and a vertical drive mechanism 68 are provided under the heating plate 62. These elevator pins 67 allow the wafer to be mounted on the heating plate 62.

As shown in FIG. 15, a transfer device 69 is disposed between the cooling plate 61 and heating plate 62 to transfer a wafer to the heating plate 62 and to transfer the wafer from the heating plate 62 to the cooling plate 61. A transfer opening 70 is formed in the enclosure 90 of the heating/cooling system 60 and adjacent to the cooling plate 62, for bringing the wafer in and taking the wafer out of the heating/cooling system 60.

In addition, this transfer opening 70 is attached with a shutter 71 to maintain an atmosphere in the heating/cooling system 60 to have a predetermined one. A transfer arm 80, which is placed opposite the shutter 71, transfers the wafer through the transfer opening 70 when the shutter 71 is opened. The transferred wafer is further transferred by the transfer device 69 onto the heating plate 62.

By using such a heating/cooling system 60, it is important to measure temperature distribution of the wafer mounted on the heating plate 62 in advance to grasp temperature characteristics of the wafer on the heating plate 62 and to heat the wafer on the heating plate 62 uniformly with appropriate compensation based on the results. In order to measure the temperature distribution of the wafer on the heating plate 62, temperature measuring devices have been conventionally used to grasp the temperature distribution of the wafer and adjust the temperature distribution before the actual treatment of the wafer.

FIG. 17A and 17B illustrate some examples of the conventional temperature measuring device. An example shown in FIG. 17A comprises a wafer K for use in measuring temperature, which is made of the same material and in the same shape as the real semiconductor wafer, a plurality of temperature sensors 101 spread over the temperature-measuring wafer K to detect temperatures with the use of thermocouples or the like, and a transmitting device 103. The temperature sensors 101 are connected to the transmitting device 103 through cables 102. Data detected by each temperature sensor 101 is sent from the transmitting device 103 by radio and then received by a receiving device disposed inside or outside the heating/cooling system 60. Because the temperature data detected by each temperature sensor 101 is represented by analog values, the transmitting device 103 needs to incorporate an A/D converter to convert the analog temperature data into digital data. However, the A/D converter that deteriorates conversion accuracy with an increase in temperature may be able to be used to measure temperatures up to about 150 degrees C., but can not be used in the atmosphere at temperatures rising to 250 degrees C.

Japanese unexamined patent publication No. 2002-124457 discloses another example as shown in FIG. 17B in which the transmitting device 103 shown in FIG. 15A is disposed on a disc S that is prepared in addition to the temperature-measuring wafer K and each temperature sensor 101 on the temperature-measuring wafer K is connected to the transmitting device 103 via cables 102. Since this example is configured to mount only the temperature-measuring wafer K on the heating plate 62 and to locate the disc S above the temperature measuring wafer K with a distance therebetween, the A/D converter can keep a distance from the heating plate 62, and therefore the A/D converter incorporated in the transmitting device 103 is prevented from accuracy deterioration caused by high temperatures.

However, the temperature-measuring wafer K with the disc S located thereabove causes difficulty in transferring wafers with the transfer device 69 and transfer arm 80 shown in FIG. 16, thus requiring a specially prepared transfer device and transfer arm.

Alternatively, Japanese unexamined patent publication No. 2004-150860 discloses another example of the temperature measuring device using a surface acoustic wave device (hereinafter referred to as "SAW device"). As shown in FIG. 18, this example comprises antenna sections 111 and a SAW device 113 including an excitation electrode 112 connected to the antenna sections 111 in a package body 110 made of a dielectric material. This publication discloses that with the use of the characteristics of the SAW device 113 which generates surface acoustic waves having a propagation velocity that is variable depending on temperature, temperature is determined by measuring how long the reflected surface acoustic wave take to return and calculating from temperature delay of the SAW device 113 in an arithmetic circuit at a base station.

In order to uniformly heat wafers with the heating/cooling system 60 shown in FIG. 15, automated measurement of the temperature distribution of a wafer mounted on the heating plate 62 is required. In the example using the SAW device 113 shown in FIG. 18, however, it may be possible to measure temperature of a certain region of the wafer, but is impossible to measure temperature distribution at various regions of the wafer. Even if the SAW device 113 is replaced with the temperature sensors 101 shown in FIGS. 17A and 17B, temperature measurement of various regions on a wafer cannot be achieved because the reflected frequency waves of the temperature sensors 101 interfere with each other.

SUMMARY OF THE INVENTION

It is an object of the present invention to provide a temperature measuring device capable of eliminating the need for an A/D converter, adapting itself to automation and measuring temperature distribution of the upper surface of a wafer by improving the heat resistance, a thermal processor having a temperature measurement function and a temperature measurement method.

This invention is directed to a temperature measuring device comprising a wafer and a plurality of temperature sensors arranged in regions which are formed by segmenting the upper surface of the wafer into a plurality of regions. Each temperature sensor includes oscillation circuit that oscillates in response to receipt of a signal to output an oscillation frequency signal corresponding to the temperature of its own region.

DESCRIPTION OF PREFERRED EMBODIMENT (1) The First Embodiment

Figure 1:
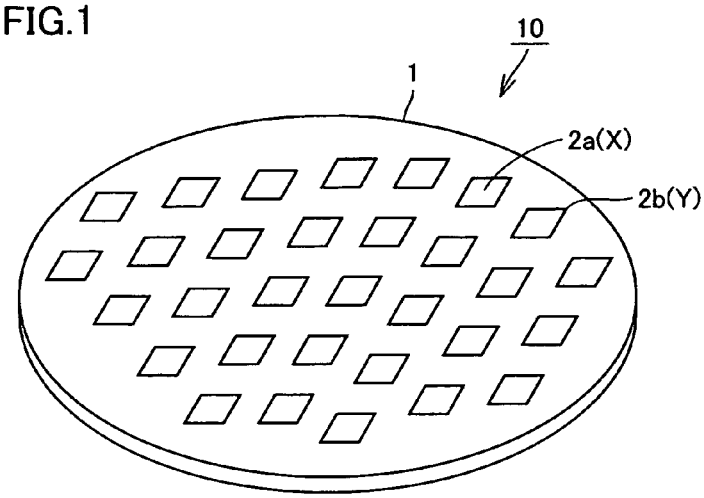
FIG. 1 is a perspective view illustrating an appearance of a wafer-type temperature sensor according to the first embodiment of the invention.
Figure 2:
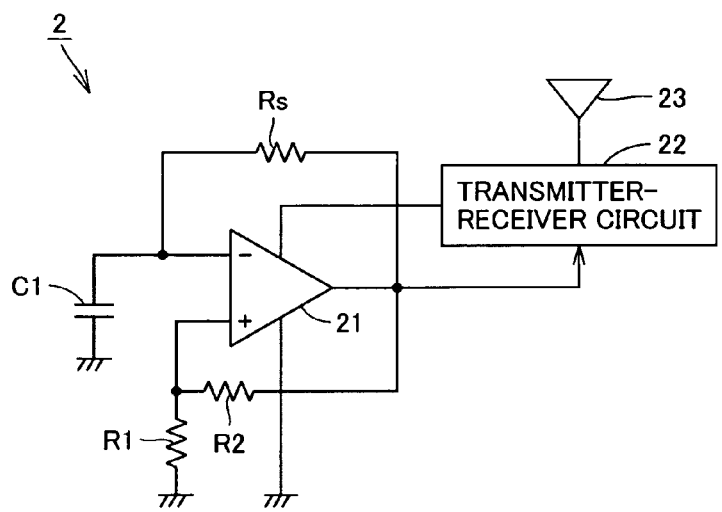
FIG. 2 illustrates an oscillation circuit constituting the wafer-type temperature sensor shown in FIG. 1.

FIG. 1 is a perspective view illustrating the appearance of a wafer-type temperature sensor according to the first embodiment of the invention, while FIG. 2 is a circuit diagram of an oscillation circuit constituting the wafer-type temperature sensor shown in FIG. 1.

FIG. 1, a wafer-type temperature sensor 10 includes a wafer 1 and a plurality of temperature sensors 2a, 2b arranged in regions X, Y which are formed by segmenting the upper surface of the wafer 1 into a plurality of regions. The wafer-type temperature sensor 10 mounted on the heating plate 62 shown in FIG. 13 measures temperature distribution of the wafer prior to the actual treatment of wafers on the heating plate 62 in order to grasp the temperature characteristics of the wafer on the heating plate 62. Then, the wafer-type temperature sensor 10 makes appropriate temperature adjustment based on the detection results and determines a temperature capable of uniformly heating the wafer to be treated on the heating plate 62.

More preferably, each of the temperature sensors 2a, 2b comprises an oscillation circuit 2. The oscillation circuit 2 includes an operational amplifier 21, a capacitor C1 connected between an inverting input terminal (−) of the operational amplifier 21 and grounding, a resistance Rs connected between the inverting input terminal and an output terminal, a resistance R1 connected between a non-inverting input terminal (+) and grounding, and a resistance R2 connected between the non-inverting input terminal and the output terminal. The resistance Rs is a temperature dependent device that changes the resistance value depending on temperature. Additionally, the capacitor C1 and operational amplifier 21 also have temperature-dependency. The oscillation frequency $f_0$ of the oscillation circuit 2 is defined by the constants of the capacitor C1 and resistance Rs, and represented by $f_0 \approx 1/(2 \cdot C1 \cdot Rs)$.

The output of the oscillation circuit 2 is connected to a transmitter-receiver circuit 22 that is connected to an element antenna 23. The transmitter-receiver circuit 22 receives microwave signals transmitted from a logger 12, which will be described later with reference to FIG. 4, through the element antenna 23, converts the signals into power supply voltage to supply it to the operational amplifier 21, and transmits oscillation frequency signals from the oscillation circuit 2 to the logger 12. The transmitter-receiver circuit 22 serves as the communication unit. Supplying the power supply voltage to the oscillation circuit 2 can be also achieved by incorporating a battery in the wafer-type temperature sensor 10. As long as the battery is configured to supply power supply voltage to each oscillation circuit 2, there is no necessity for the logger 12 to transmit the microwaves.

Figure 3:
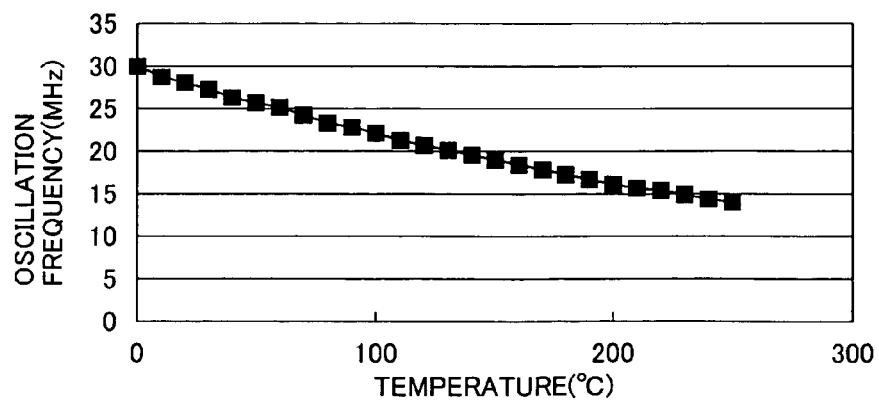
FIG. 3 illustrates the temperature characteristics of the oscillation circuit shown in FIG. 2.

FIG. 3 illustrates the temperature characteristics of the oscillation circuit 2 shown in FIG. 2. In FIG. 3, the vertical axis represents oscillation frequency $f_0$, while the horizontal axis represents temperature. The capacitance of the capacitor C1 in the oscillation circuit 2 shown in FIG. 2 is 10 pF, the resistance value of the resistance Rs is 500Ω, and Tcr, which represents temperature dependency, is 0.3%/degree C. For example, when the temperature is 0 degree C., the resistance value of the resistance Rs shows 500Ω and the oscillation circuit 2 oscillates at an oscillation frequency $f_0$ of 30 MHz as shown in FIG. 3.

With an increase in temperature, the resistance value of the resistance Rs increases gradually, on the other hand the oscillation frequency $f_0$ of the oscillation circuit 2 is lowered. For instance, when the temperature rises to 250 degrees C., the resistance value of the resistance Rs rises to 1047Ω, while the oscillation frequency $f_0$ of the oscillation circuit 2 decreases to 14.3 MHz. In this instance, with the temperature change of 0.05 degrees C., the oscillation frequency $f_0$ changes from 4 kHz to 2 kHz per second. In comparison with the conventional example capable of detecting temperature changes with an accuracy of 0.1 degrees C. at temperature of 150 degrees C., this embodiment can measure the temperature changes with an accuracy of 0.05 degrees C. at temperature of 250 degrees C., and therefore can improve measurement accuracy.

Accordingly, the use of a counter having 10 digits to 12 digits of resolution per second of gate time and a frequency bandwidth of 225 MHz enables temperature measurement by the wafer-type temperature sensor 10 based on the oscillation frequency $f_0$ of the oscillation circuit 2. The oscillation circuit 2 can output a pulse signal of the oscillation frequency $f_0$ that varies depending on temperature. In other words the oscillation circuit 2 has a function as an A/D converter, which means the oscillation circuit 2 does not need to include the A/D converter and enables measurement of high temperatures, even 250 degrees C. and higher, with good accuracy.

Further, the oscillation circuits 2 that are hermetically imbedded in the surface of the wafer-type temperature sensor 10 do not suffer degradation from atmospheric gas and other factors in the measurement environment, thereby obtaining high reliability.

Descriptions will be made about a method for measuring temperature with the wafer-type temperature sensor 10 including the thus configured oscillation circuits 2. The temperature sensors 2a located in the previously defined regions X on the wafer-type temperature sensor 10 shown in FIG. 1 are designed to have a frequency variable range from f1 to f2 within a measurement temperature range, while the temperature sensors 2b located on the previously defined regions Y are designed to have a frequency variable range from f3 to f4 within a measurement temperature range, for the purpose of allocating different frequency bands to the regions to be measured. In the case of f1<f2<f3<f4, detection of the frequency bands of f1 and f2 can identify the previously defined regions X on the wafer-type temperature sensor 10, and the temperatures of the regions X can be obtained by determining the value of each frequency within the frequency bands of f1 and f2. In the same manner, detection of the frequency bands of f3 and f4 can identify the previously defined regions Y on the wafer-type temperature sensor 10, and the temperatures of the regions Y can be obtained by determining the value of each frequency within the frequency bands of f3 and f4.

Figure 4:
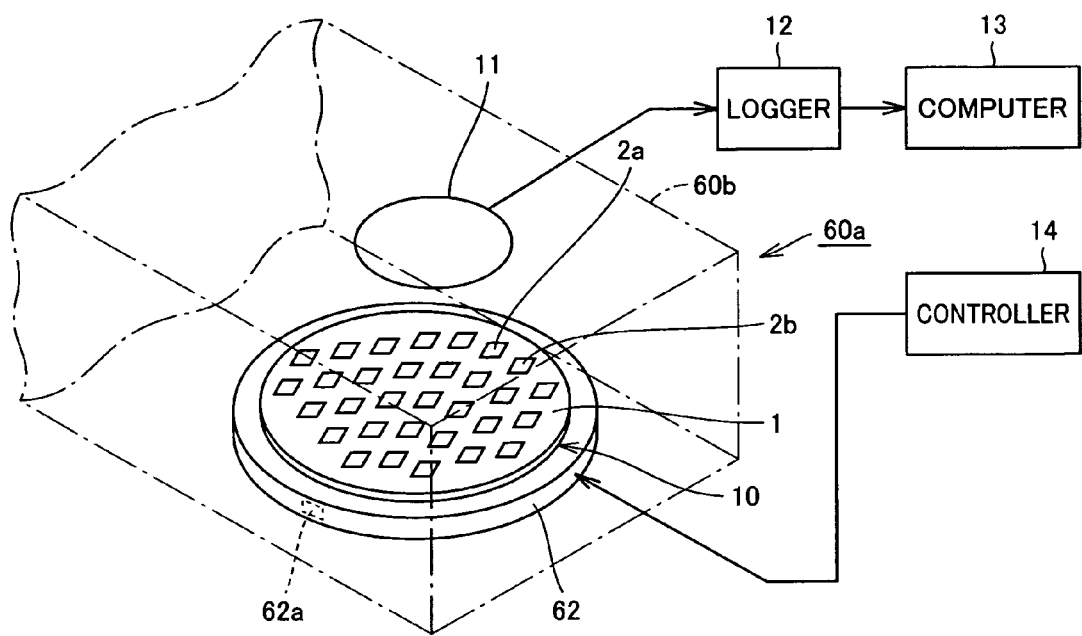
FIG. 4 illustrates an example of a heating/cooling system with the wafer-type temperature sensor shown in FIG. 1 arranged therein to measure temperature.
Figure 5:
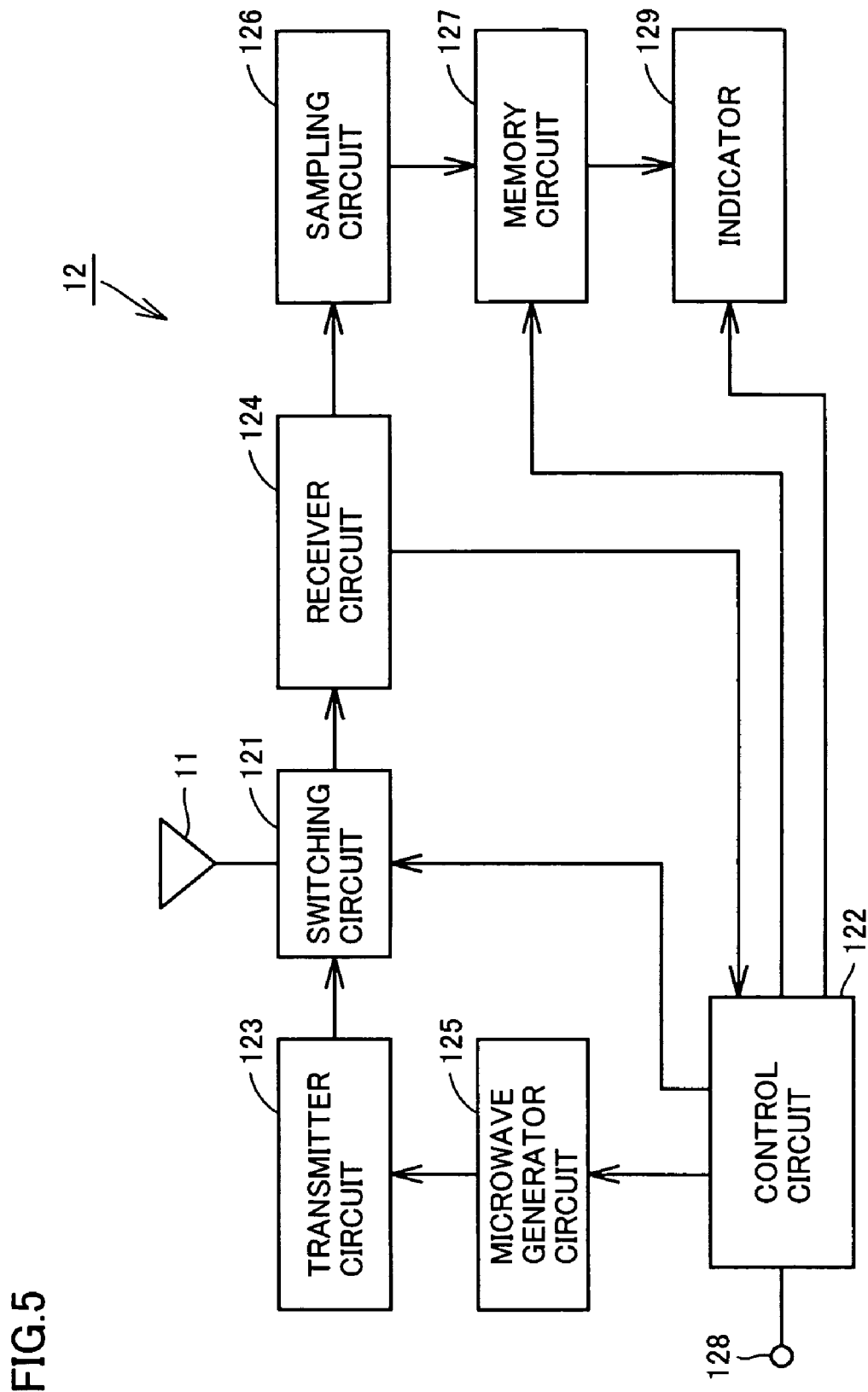
FIG. 5 is a block diagram specifically illustrating the logger shown in FIG. 4.

FIG. 4 illustrates an example of the heating/cooling system 60a with the wafer-type temperature sensor 10 shown in FIG. 1 arranged therein to measure temperature. FIG. 5 is a block diagram specifically illustrating the logger 12 shown in FIG. 4.

Figure 13:
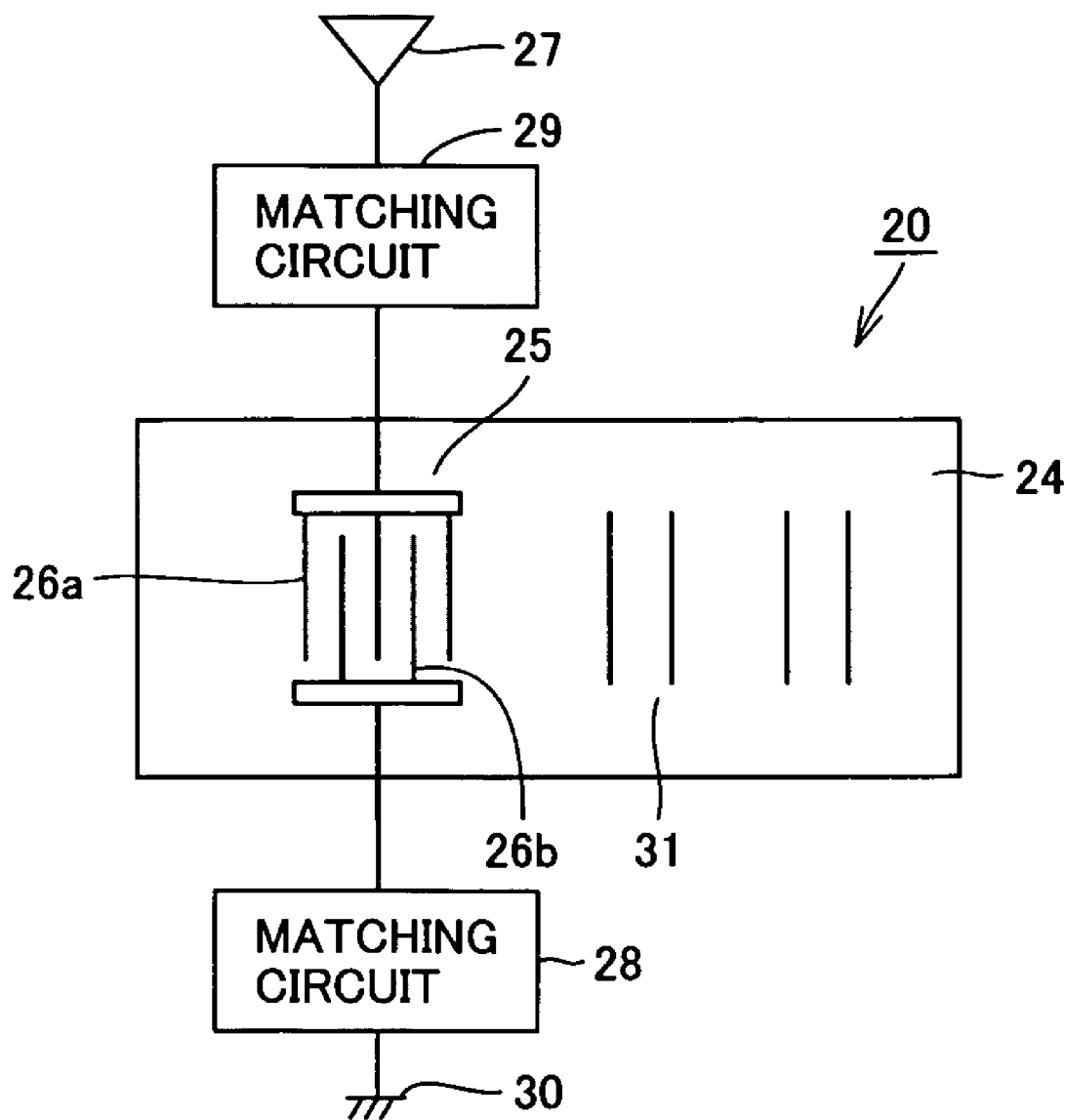
FIG. 13 illustrates a SAW device included in the wafer-type temperature sensor in the second embodiment.
Figure 14:
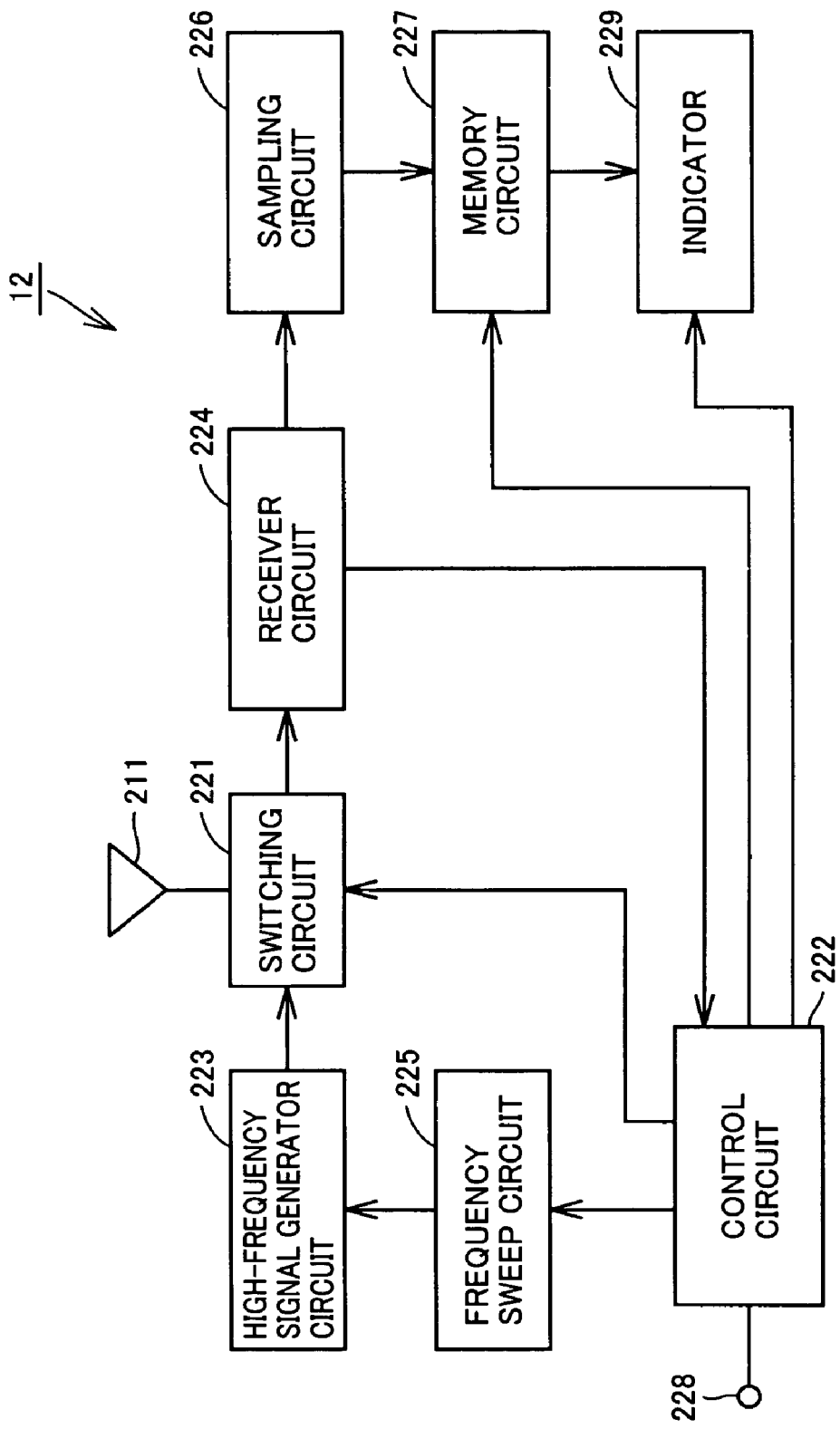
FIG. 14 is a block diagram of the logger in the second embodiment.
Figure 15:
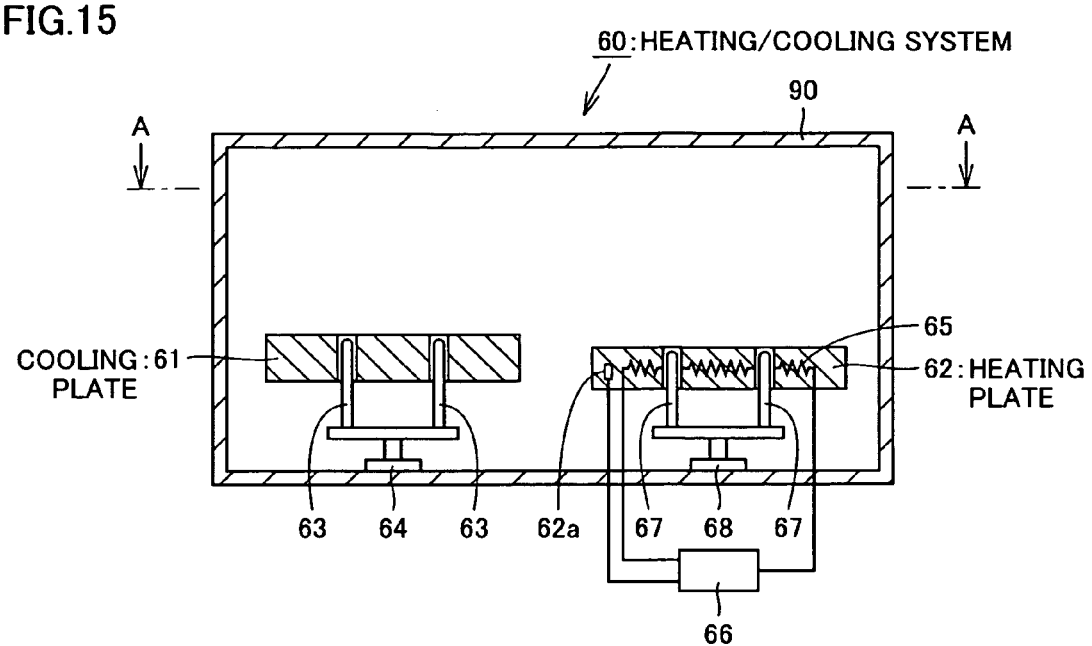
FIG. 15 is a vertical cross-sectional view of a conventional heating/cooling system.
Figure 16:
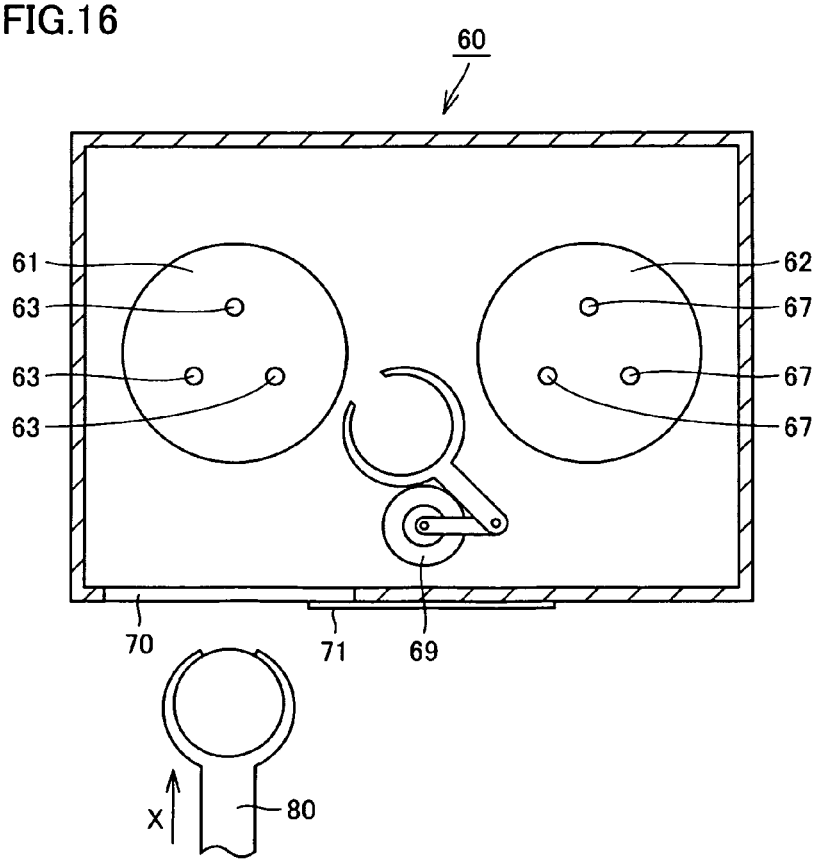
FIG. 16 is a transverse sectional view taken along lines A-A of FIG. 15.
Figure 17A:
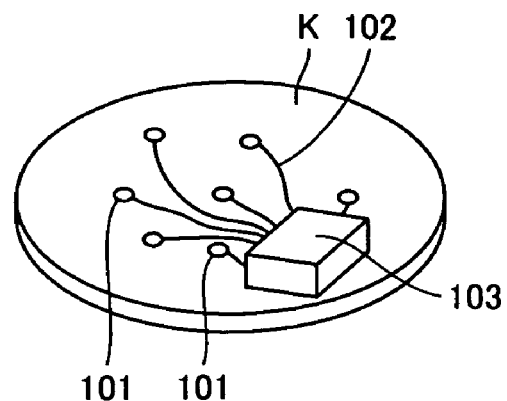
FIG. 17A and 17B illustrate examples of the conventional temperature measuring device.
Figure 17B:
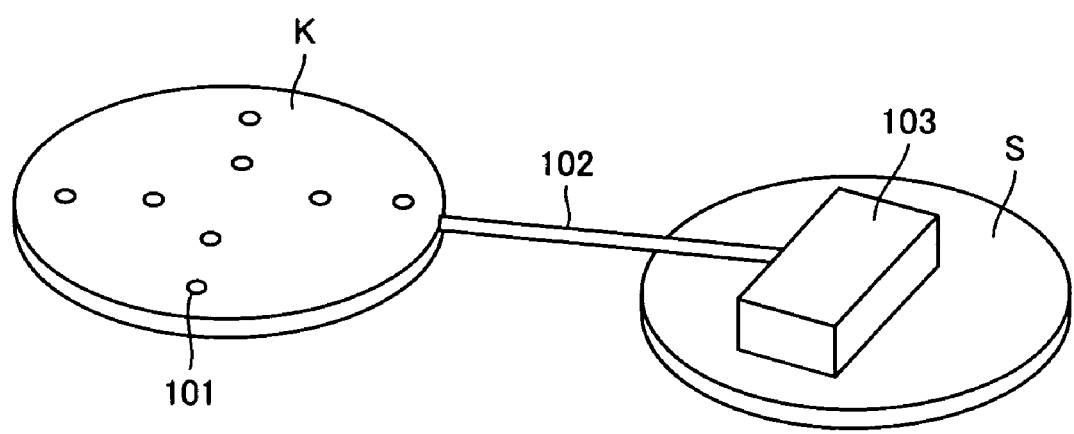
Figure 18:
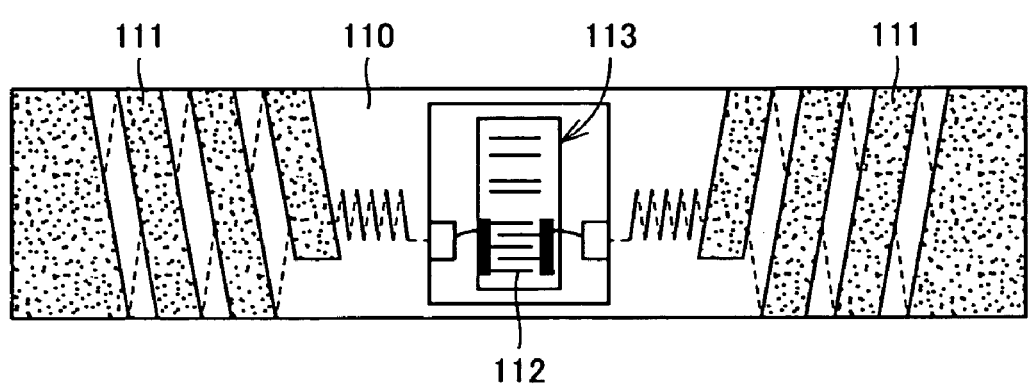
FIG. 18 illustrates an example of conventional temperature measuring devices using a SAW device.

In FIG. 4, the heating/cooling system 60a has generally the same structure as that of the heating/cooling system 60 shown in FIGS. 13 and 14. The heating plate 62 discussed in FIG. 13 is placed in the enclosure 60b and includes a heating-plate temperature sensor 62a therein. Note that the cooling plate 61 is not illustrated herein. An antenna 11 is attached to the ceiling of the enclosure 60b. The antenna 11 comprises, for example, a spiral wound coil made from a conductor. The antenna 11 transmits microwave signals from the logger 12 functioning as transmitting-receiving unit into the enclosure 60b, while receiving oscillation frequency signals oscillated by the oscillation circuits 2 to supply them to the logger 12. The logger 12 calculates the temperatures of the wafer-type temperature sensor 10 based on the received oscillation frequency signals and displays the results, while outputting the calculated temperature data to a computer 13. A controller 14 controls a heater (not shown) incorporated in the heating plate 62 based on the temperature detected by the heating-plate temperature sensor 62a.

Next description will be made about the structure and operation of the logger 12 by referring to FIG. 5. The antenna 11 shown in FIG. 4 is connected to a switching circuit 121. The switching circuit 121 is switched under control of a control circuit 122 to a transmitter circuit 123, upon transmission of the microwaves and to a receiver circuit 124, upon receipt of the oscillation frequency signals from the oscillation circuits 2. The transmitter circuit 123 is supplied with microwave signals from a microwave generator circuit 125 serving as the power supply unit.

The receiver circuit 124 receives the oscillation frequency signals output from the oscillation circuits 2 through the antenna 11 and extracts measured data of the measurement temperature corresponding to the oscillation frequency to output it to a sampling circuit 126. The sampling circuit 126 samples the data of the measurement temperature per sampling time to convert it into time-series data. The time-series data is stored in a memory circuit 127. The control circuit 122 numerically processes the data stored in the memory circuit 127 to obtain an average value, deviation value and so on, and then displays the values on an indicator 129. In addition, the control circuit 122 outputs the data from an output terminal 128 to supply the data to the computer 13 shown in FIG. 4. The control circuit 122 serves as the determination unit for determining temperatures of the respective regions on the wafer based on the oscillation frequency signals oscillated by the plurality of oscillation circuit.

Figure 6:
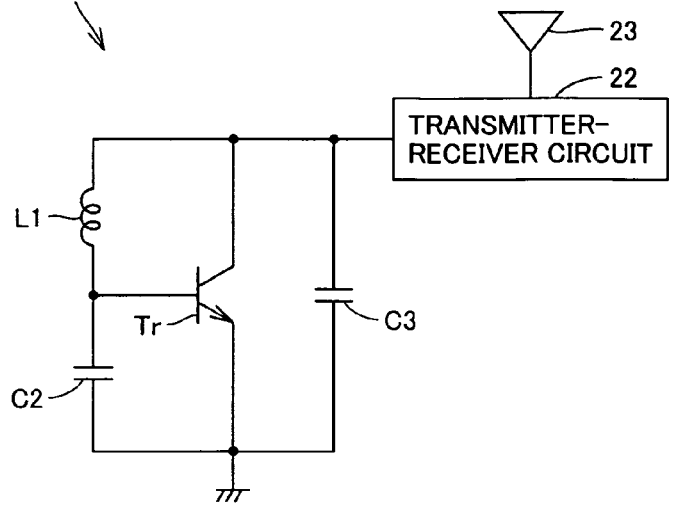
FIG. 6 is a circuit diagram illustrating another example of the oscillation circuit included in the wafer-type temperature sensor according to one embodiment of the invention.

FIG. 6 is a circuit diagram illustrating another example of the oscillation circuit included in the wafer temperature sensor 10 according to one embodiment of the invention. The oscillation circuit 2 shown in FIG. 2 uses the operational amplifier 21, but an oscillation circuit 2c shown in FIG. 6 is made up with a Colpitts oscillation circuit. Specifically, a capacitor C2 is connected between the base of a transistor Tr and grounding, a coil L1 is connected between the base of the transistor Tr and the collector, a capacitor C3 is connected between the collector and grounding. The emitter of the transistor Tr is grounded, while the collector of the transistor Tr is connected to the transmitter-receiver circuit 22 discussed in FIG. 2. The transmitter-receiver circuit 22 is connected to a communication antenna 23.

In the oscillation circuit 2c shown in FIG. 6, the coil L1 has a temperature dependency in which the inductance changes depending on temperature, while the transistor Tr has a temperature dependency in which the current amplification factor changes depending on temperature. The transmitter-receiver circuit 22 receives a microwave from logger 12 through the element antenna 23 and converts the microwave into power supply voltage to supply it to the oscillation circuit 2c. The oscillation circuit 2c starts self-oscillation upon receipt of the power supply voltage, and the oscillation frequency signal is transmitted from the transmitter-receiver circuit 22 through the element antenna 23 to the logger 12. Since the coil L1 and transistor Tr have temperature dependency each, the oscillation frequency changes according to temperature. Accordingly, imbedding this oscillation circuit 2c in each region X, Y on the wafer-type temperature sensor 10 for the temperature sensors 2a, 2b shown in FIG. 1 enables measurement of the temperature in the respective regions on the wafer-type temperature sensor 10.

Figure 7:
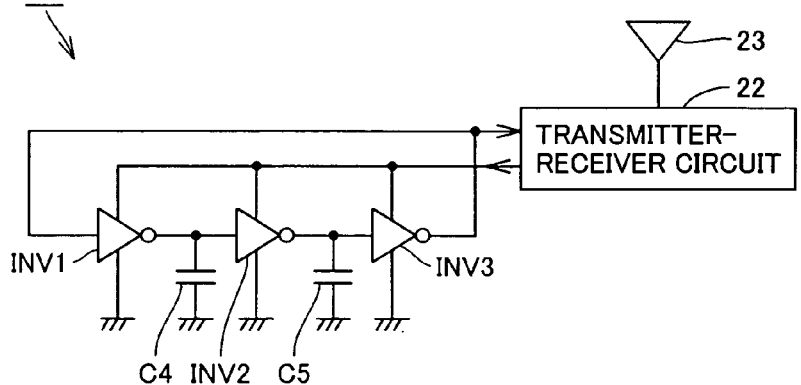
FIG. 7 is a circuit diagram illustrating yet another example of the oscillation circuit included in the wafer-type temperature sensor according to one embodiment of the invention.

FIG. 7 is a circuit diagram illustrating yet another example of the oscillation circuit included in the wafer-type temperature sensor according to one embodiment of the invention. An oscillation circuit 2d shown in FIG. 7 is made up with a ring oscillator. The oscillation circuit 2d includes three inverters INV1 to INV3 connected in series. Specifically the output terminal of the inverter INV3 is connected to the input terminal of the inverter INV1, a capacitor C4 is connected between the input terminal of the inverter INV2 and grounding, a capacitor C5 is connected between the input terminal of the inverter INV3 and grounding.

Each of the inverters INV1 to INV3 is made up with a MOS transistor and has a current drive capability that changes depending on temperature and therefore the charge/discharge current changes according to temperature. Because of this, the driving current depends on the oscillation frequency. Supplying the output from the inverter INV3 to the transmitter-receiver circuit 22 allows the oscillation frequency signal to be output through the element antenna 23 to the logger 12.

The transmitter-receiver circuit 22 receives a microwave from the logger 12 through the element antenna 23 and converts the microwave into power supply voltage to supply it to the oscillation circuit 2d. The oscillation circuit 2d self-oscillates, and the oscillation frequency signal is transmitted from the transmitter-receiver circuit 22 through the element antenna 23 to the logger 12. Since the inverters INV1 to INV3 have a temperature dependency each, the oscillation frequency changes according to temperature. Accordingly, imbedding this oscillation circuit 2d in each region X, Y on the wafer-type temperature sensor 10 for the temperature sensors 2a, 2b shown in FIG. 1 enables measurement of the temperature in the respective regions on the wafer-type temperature sensor 10.

It should be noted that the oscillation circuit in use is not limited to the Colpitts-type oscillation circuit shown in FIG. 6 and the ring oscillator-type oscillation circuit shown in FIG. 7, but a Hartley-type oscillation circuit and other types of oscillation circuits are also available as long as the oscillation circuit changes its oscillation frequency according to temperature.

Figure 8:
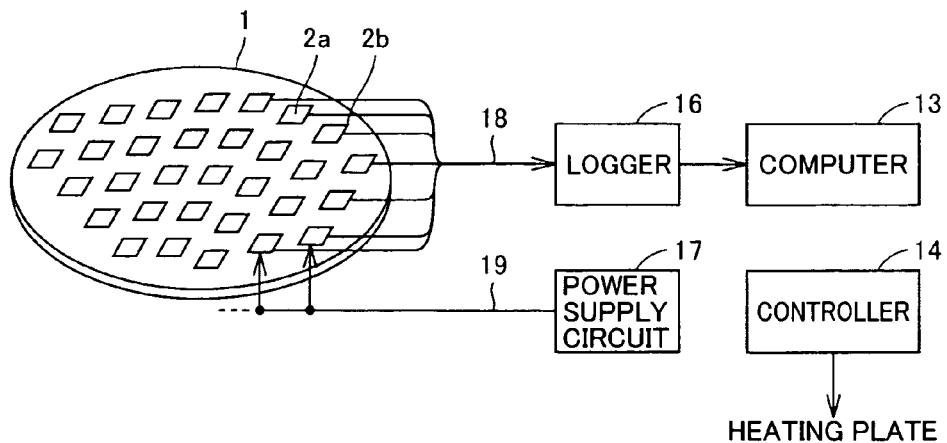
FIG. 8 illustrates an embodiment in which the wafer-type temperature sensor and logger are connected to each other through wires.

FIG. 8 illustrates an embodiment in which the temperature sensors 2a, 2b on the wafer-type temperature sensor 10 are connected to the logger 16 by wire. Each of the temperature sensors 2a, 2b on the wafer-type temperature sensor 10 has an oscillation output terminal connected to the logger 16 through cables 18 and a power input terminal connected to a power supply circuit 17 through cables 19. The logger 16 does not include the antenna 11, switching circuit 121, transmitter circuit 123, receiver circuit 124 and microwave generator circuit 125 included in the logger 12 shown in FIG. 5, and is configured so that the sampling circuit 126 directly receives the oscillation frequency signal through the cables 18.

In this embodiment shown in FIG. 8, the oscillation frequency signals from each of the temperature sensors 2a, 2b can be directly sampled, thereby eliminating the need to identify the respective regions on the wafer-type temperature sensor 10. Because of this, the oscillating frequencies of the temperature sensors 2a, 2b can be selected from frequencies within the same frequency band.

Figure 9A:
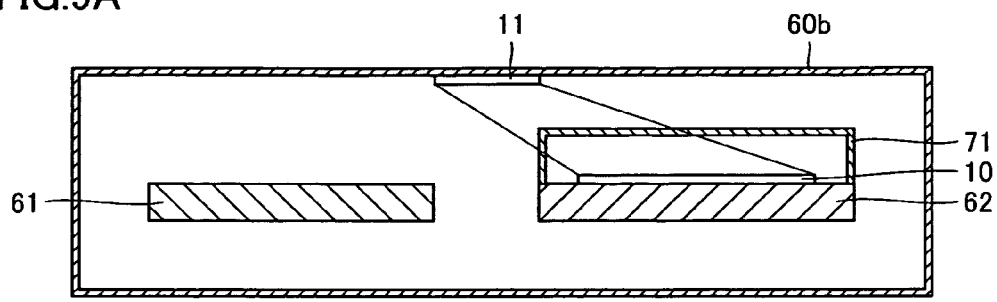
FIGS. 9A, 9B, 9C are illustrations of an example of the temperature measuring device according to one embodiment of the invention, to describe the way of measuring the temperature of the heating plate and cooling plate.
Figure 9B:
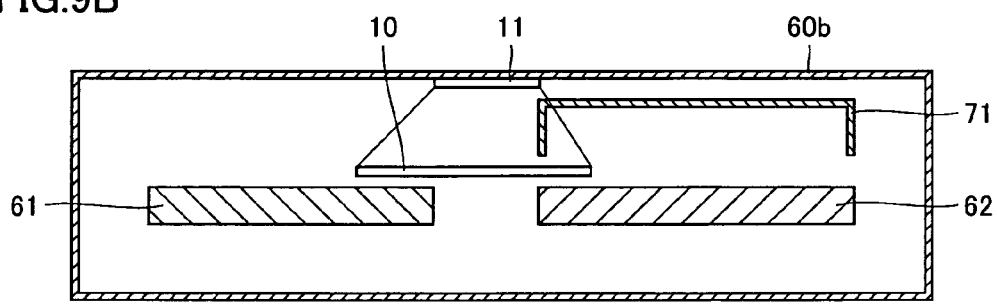
Figure 9C:
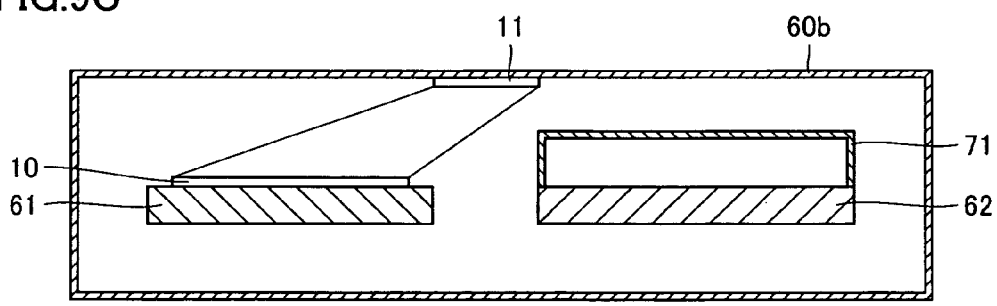

FIGS. 9A to 9C are explanatory drawings of a method for measuring temperature of the heating plate 62 and cooling plate 61 with the temperature measuring device according to one embodiment of the invention. In FIG. 9A, the cooling plate 61 and heating plate 62 are disposed in an enclosure 60b in the same manner as FIG. 13. Also, the cooling plate 61 and heating plate 62 are attached with a vertical drive mechanism discussed in FIG. 13, but its illustration is omitted. An openable cover member, or a chamber cover 71 is mounted on the heating plate 62.

On a part of the ceiling of the enclosure 60b positioned between the cooling plate 61 and heating plate 62 disposed is the antenna 11 discussed in FIG. 4. Since the antenna 11 is not located right above the heating plate 62, the antenna 11 can be prevented from temperature rise. The chamber cover 71 has a window (not shown) allowing a wave to pass therethrough. The logger 12, computer 13 and controller 14 shown in FIG. 4 are located away from the heating plate 62 and in an atmosphere at room temperature.

By referring to FIGS. 9A to 9C, the temperature measurement method will be described. First, a wafer-type temperature sensor 10 is transferred through a transfer opening (not shown) of the enclosure 60b by the transfer arm discussed in FIG. 14, and then the chamber cover 71 on the heating plate 62 is lifted open. Next, the wafer-type temperature sensor 10 is transferred onto the heating plate 62 by the transfer device discussed in FIG. 11, and then is aligned with the heating plate 62. Subsequently, as shown in FIG. 9A, the chamber cover 71 descends to close the upper part of the heating plate 62. As discussed in FIG. 4, with the emission of the microwave signal from the antenna 11, the oscillation circuits on the wafer-type temperature sensor 10 are supplied with electrical power to emit oscillation frequency signals which are captured by the antenna 11. Upon completion of the heat treatment, as shown in FIG. 9B, the chamber cover 71 is again lifted, and then the wafer-type temperature sensor 10 is transferred by the transfer device from the heating plate 62 to the cooling plate 61.

Even during transfer, the antenna 11 continuously emits the microwave signals onto the wafer-type temperature sensor 10, while capturing the oscillation frequency signals corresponding to various temperatures on the wafer-type temperature sensor 10. Since the antenna 11 can emit the microwave even after the wafer-type temperature sensor 10 has been transferred onto the cooling plate 61 as shown in FIG. 9C, the oscillation frequency signals corresponding to various temperatures on the wafer-type temperature sensor 10 can still be captured by the antenna 11. Thus, the wafer-type temperature sensor 10 enables detection of the temperatures after being cooled. After that, the wafer-type temperature sensor 10 is ejected.

As mentioned above, the example shown in FIGS. 9A to 9C enables transmission of the microwave signal and receipt of the oscillation frequency signal via the antenna 11 even during heating treatment by the heating plate 62 and cooling treatment by the cooling plate 61, and therefore continuous measurement of the heating temperature and cooling temperature can be achieved with the wafer-type temperature sensor 10.

Figure 10A:
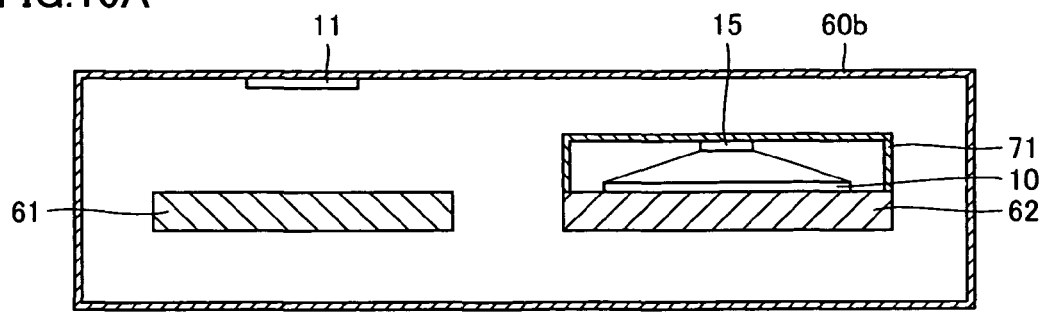
FIGS. 10A, 10B, 10C are explanatory drawings of another example of the temperature measuring device according to one embodiment of the invention, to describe the way of measuring the temperature of the heating plate and cooling plate.
Figure 10B:
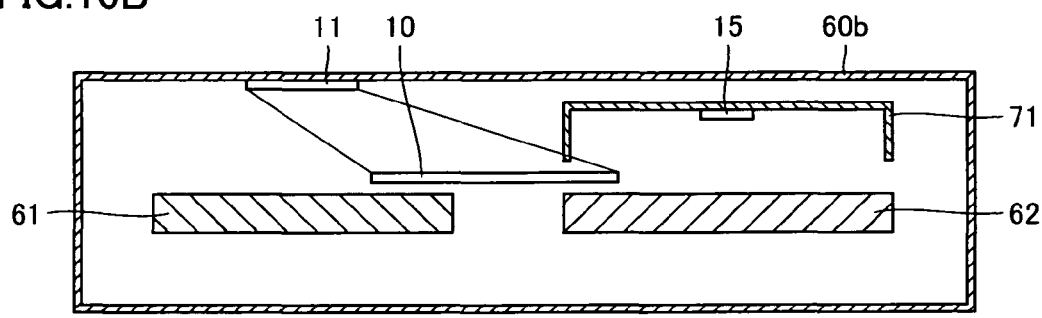
Figure 10C:
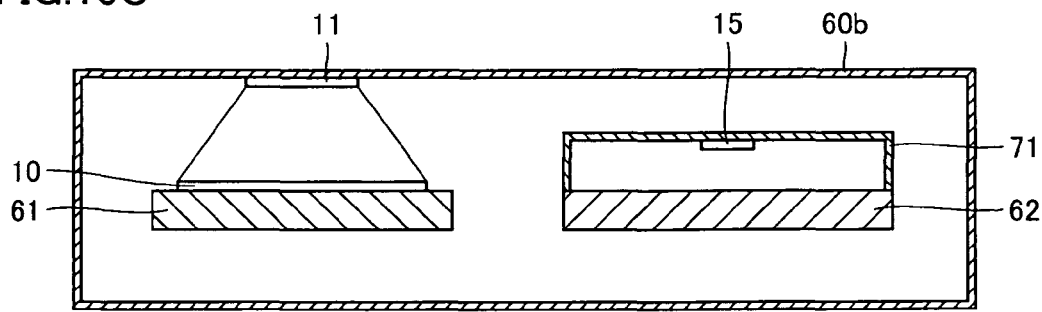

FIGS. 10A to 10C are explanatory drawings of another example of the method for measuring temperature of the heating plate and cooling plate with the temperature measuring device according to one embodiment of the invention.

In this example, the antenna 11 is attached to the ceiling of the enclosure 60b and above the cooling plate 61, and an auxiliary antenna 15 is disposed in the chamber cover 71. The auxiliary antennas 15 disposed in the chamber cover 71 may be plural. When the chamber cover 71 is opened, the wafer-type temperature sensor 10 is transferred onto the heating plate 62. As shown in FIG. 10A, the microwave signals emitted by the auxiliary antenna 15 are supplied to the wafer-type temperature sensor 10, and then the frequency signals corresponding to measured temperatures of the respective regions are captured by the auxiliary antenna 15.

Upon completion of the heat treatment, as shown in FIG. 10B, the chamber cover 71 is opened, and then the wafer-type temperature sensor 10 is transferred from the heating plate 62 to the cooling plate 61. At this point, the auxiliary antenna 15 is switched to the antenna 11 above the cooling plate 61 to transmit the microwave signals to the wafer-type temperature sensor 10 in the middle of transfer, and then the oscillation frequency signals from the wafer-type temperature sensor 10 are captured by the antenna 11. As shown in FIG. 10C, after the wafer-type temperature sensor 10 is transferred onto the cooling plate 61, the antenna 11 transmits the microwave signals, and the wafer-type temperature sensor 10 outputs the oscillation frequency signals corresponding to the respective temperatures.

In this example, the auxiliary antenna 15 is made of metallic materials capable of resisting high temperatures of 200 degrees C. and higher. The logger 12, computer 13 and controller 14 shown in FIG. 4 are located away from the heating plate 62, that is in an atmosphere at room temperature.

As mentioned above, the example shown in FIGS. 10A to 10C enables transmission and reception of signals via the auxiliary antenna 15 during heating treatment by the heating plate 62 and enables transmission and reception of signals via the antenna 11 during cooling treatment by the cooling plate 61, and therefore continuous measurement of the heating temperature and cooling temperature can be achieved.

Figure 11A:
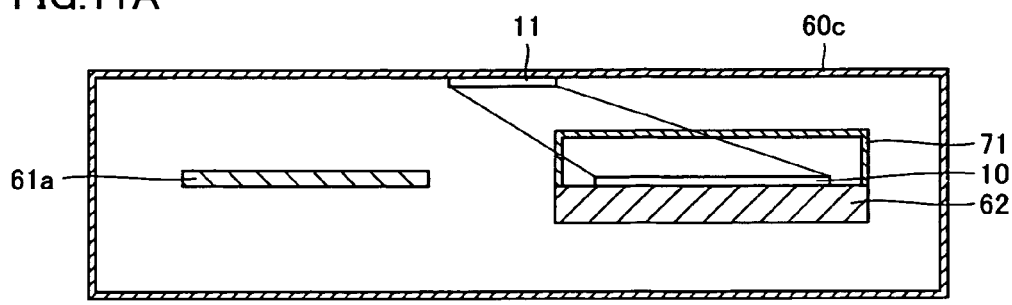
FIGS. 11A, 11B, 11C are explanatory drawings of yet another example of the temperature measuring device having a temperature measurement function according to one embodiment of the invention, to describe the way of measuring the temperature of the heating plate and cooling plate.
Figure 11B:
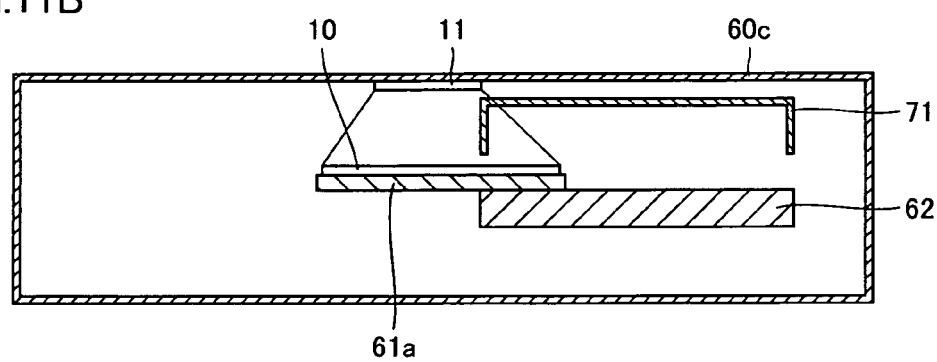
Figure 11C:
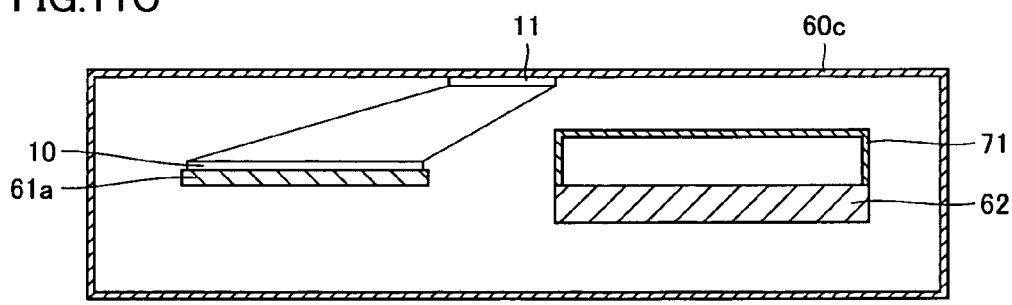

FIGS. 11A to 11C are explanatory drawings of yet another example of the method for measuring temperature of the heating plate and cooling plate with the temperature measuring device having a temperature measurement function according to one embodiment of the present invention.

Although the aforementioned examples shown in FIGS. 9A to 10C are configured to include the cooling plate 61 and transfer device 69 separately in the same manner as shown in FIG. 14, the example shown in FIGS. 11A to 11C is configured to include the cooling plate 61a having a wafer transfer function. Other components of the example shown in FIGS. 11A to 11C are the same as those of the example shown in FIGS. 9A to 9C.

First, after the chamber cover 71 is lifted open, the cooling plate 61a receives the wafer-type temperature sensor 10 transferred to the transfer opening to transfer it onto the heating plate 62. Next, the chamber cover 71 descends to close the heating plate 62. Subsequently the antenna 11 emits the microwave signals and receives frequency signals sent back from the wafer-type temperature sensor 10. Upon completion of the heat treatment, as shown in FIG. 11B, the chamber cover 71 is lifted, and then the cooling plate 61a moves onto the heating plate 62 to pull out the wafer-type temperature sensor 10 from the heating plate 62.

Even during transfer, the antenna 11 continuously emits the microwave signals to the wafer-type temperature sensor 10, while capturing the oscillation frequency signals corresponding to the respective temperatures on the wafer-type temperature sensor 10. Subsequently, as shown in FIG. 11C, the cooling plate 63 stops the transferring operation. Since the antenna 11 can transmit the microwave signals even in this situation, the oscillation frequency signals corresponding to the respective temperatures on the wafer-type temperature sensor 10 are also sent back to the antenna 11. After that, the wafer-type temperature sensor 10 is taken out by the transfer arm.

Figure 12A:
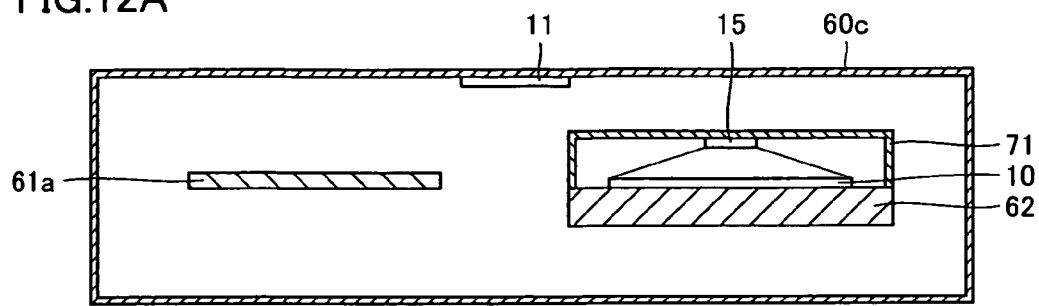
FIGS. 12A, 12B, 12C are explanatory drawings of yet another example of the temperature measuring device having a temperature measurement function according to one embodiment of the invention, to describe the way of measuring the temperature of the heating plate and cooling plate.
Figure 12B:
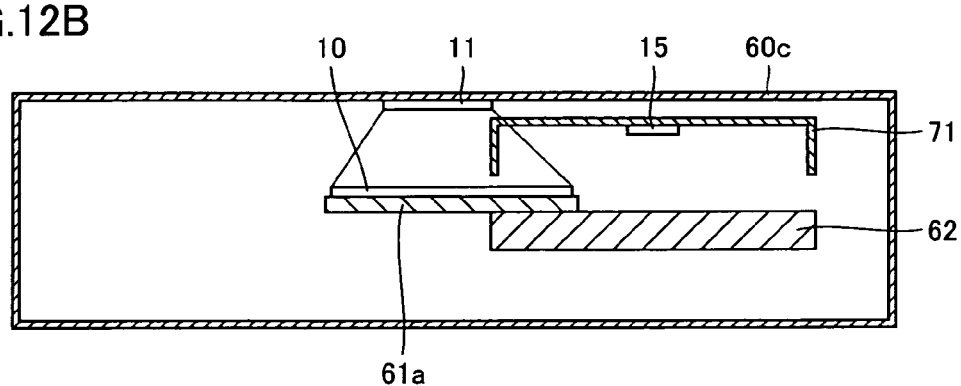
Figure 12C:
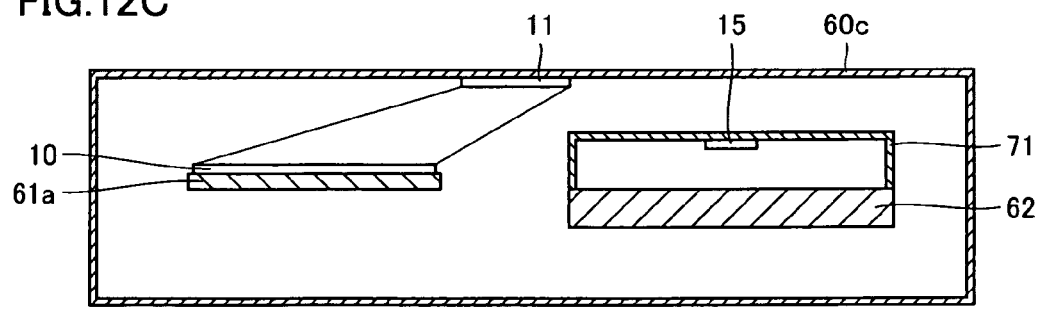

FIGS. 12A to 12C are to describe yet another example of the method for measuring temperature of the heating plate and cooling plate with the temperature measuring device having a temperature measurement function according to one embodiment of the invention.

Similar to the example shown in FIGS. 10A to 10C, this example includes the antenna 11 attached to the ceiling of the enclosure 60c and above the cooling plate 61, the auxiliary antenna 15 located in the chamber cover 71 and the cooling plate 61a having a wafer transfer function. Since the transferring operation, heating operation and cooling operation are performed in the same manner as the example shown in FIGS. 9A to 9C and the communication of the signals between the wafer-type temperature sensor 10 and antennas 11, 15 is also performed in the same manner as the example shown in FIGS. 10A to 10C, their descriptions are not reiterated.

(2) The Second Embodiment

In the second embodiment, of the temperature sensors 2a, 2b comprises a SAW device 20 as shown in FIG. 13. The SAW device 20 includes a rectangular piezoelectric substrate 24 made of an elastic material, an excitation electrode 25 and reflecting electrodes 31 aligned with the excitation electrode 25 in the longitudinal direction at a predetermined distance therebetween on the piezoelectric substrate 24. The piezoelectric substrate 24, for example, is made of langasite ($La_3Ga_5SiO_{14}$) single crystal. This langasite piezoelectric substrate 24 that does not show phase transition until its melting point (1480 degrees C.) maintains stable piezoelectric effect, thereby enabling measurement of high temperatures.

The excitation electrode 25 includes a pair of interdigitated electrodes 26a, 26b. When a high-frequency signal at 50 MHz to 950 MHz is fed to the SAW device for example, mechanical distortion occurs at a constant frequency between the interdigitated electrodes 26a and 26b due to piezoelectric effect of the piezoelectric substrate 24, and therefore the SAW device 20 excites a surface acoustic wave. When this surface acoustic wave propagates on the surface of the piezoelectric substrate 24 and reaches the reflecting electrodes 31, the reflecting electrodes 31 are slightly displaced on the surface of the piezoelectric substrate 24, thereby generating a standing wave having a natural frequency representing both mechanical distortion and temperature.

Accordingly, by making the distances between the excitation electrode 25 and reflecting electrodes 31 of the plurality of SAW devices 20 different, the SAW devices 20 that are supplied with the high-frequency signals with a predetermined bandwidth can send back the natural frequency signals with the standing waves corresponding to the temperatures of the respective regions on the wafer-type temperature sensor 10. In this case, the power supply is not needed.

The interdigitated electrodes 26, which is one of the pair of interdigitated electrodes, is connected to an element antenna 27 via a matching circuit 29, while the interdigitated electrode 26, which is the other of the pair of interdigitated electrodes, is connected to a ground line 30 via a matching circuit 29. The element antenna 27 is made of a metallic conductor. The ground line 30 is formed on the rear surface of the piezoelectric substrate 24 so that the entire rear surface works as an electrode. The matching circuit 29 can match the impedance with the element antenna 27 to improve efficiency.

The SAW device 20 shown in FIG. 13 is suitable for miniaturization, and therefore can be arranged in the plurality of regions previously defined on the wafer-type temperature sensor 10 shown in FIG. 1. Further, the SAW devices 20 that are hermetically imbedded in the surface of the wafer-type temperature sensor 10 do not suffer degradation from atmospheric gas and other factors in the measurement environment, thereby obtaining high reliability.

Descriptions will be made about a method for measuring temperature with thus configured wafer-type temperature sensor 10. The temperature sensors 2a located in the previously defined regions X on the wafer-type temperature sensor 10 shown in FIG. 1 are designed to have a frequency variable range from f1 to f2 within a measurement temperature range, while the temperature sensors 2b located on the previously defined regions Y are designed to have a frequency variable range from f3 to f4 within a measurement temperature range, for the purpose of allocating different frequency bands to the regions to be measured. In the case of f1<f2<f3<f4, when the high-frequency signals with a frequency bandwidth from f1 to f4 are transmitted, detection of the frequency bands of f1 and f2 can identify the previously defined regions X on the wafer-type temperature sensor 10, and the temperatures of the regions X can be obtained by determining the value of each frequency within the frequency bands of f1 and f2. In the same manner, detection of the frequency bands of f3 and f4 can identify the previously defined regions Y on the wafer-type temperature sensor 10, and the temperatures of the regions Y can be obtained by determining the value of each frequency within the frequency bands of f3 and f4.

The structure of the heating/cooling system is the same as the first embodiment except that the antenna 11 receives frequency signals generated by the SAW devices 20 to supply them to the logger 12.

Next description will be made about the structure and operation of the logger 12 by referring to FIG. 14. The antenna 211 shown in FIG. 14 is connected to a switching circuit 221. The switching circuit 221 is switched under control of a control circuit 222 to a high-frequency signal generator circuit 223, which functions as a transmitting circuit, upon transmission of high-frequency signals and to a receiver circuit 224 upon receipt of the frequency signals from the SAW devices 20. The high-frequency signal generator circuit 223 sweeps the high-frequency signals having the bandwidth from f1 to f4 in response to a sweep signal from a frequency sweep circuit 225.

As mentioned above, sweeping the high-frequency signals generated by the high-frequency signal generator circuit 223 at the frequency sweep circuit 225 so that the high-frequency signals have the predetermined bandwidth enables transmission of the high-frequency signals having a broad bandwidth, and therefore a multitude of SAW devices 20 each generating a different frequency signal are available.

The receiver circuit 224 receives the frequency signals sent back from the SAW devices 20 through the antenna 211 and extracts measured data of the measurement temperature to output it to a sampling circuit 226. The sampling circuit 226 samples the data of the measurement temperature per sampling time to convert it into time-series data. The time-series data is stored in a memory circuit 227. The control circuit 222 numerically processes the data stored in the memory circuit 227 to obtain an average value, deviation value and so on, and then displays the values on an indicator 229. In addition, the control circuit 222 outputs the data from an output terminal 228 to supply the data to the computer 13 as described in the first embodiment.

The control circuit 222 serves as the determination unit for determining temperatures of the respective regions on the wafer based on the oscillation frequency signals oscillated by the plurality of oscillation circuit.

Further, a high-frequency signal generator circuit 223, a receiver circuit 224 and a frequency sweep circuit 225 constitute a transmitting and receiving unit.

In the meantime, the method for measuring temperature of the heating plate 62 and cooling plate 61 in this embodiment is the same as shown in FIG. 9A-12C in the first embodiment, the description is not reiterated.

According to one embodiment of the present invention that is configured to determine temperature based on the oscillation frequency signals oscillated by the oscillation circuit arranged on the plurality of regions on the wafer, it is possible to add the function of an A/D converter to the oscillation circuit, thereby eliminating the need for the A/D converter, adapting the wafer-type temperature sensor to automation and improving the heat resistance to measure temperature distribution of the wafer.

According to the other embodiment of the present invention, identification of each region on the wafer and determination of the temperature can be achieved at the same time by supplying high-frequency signals having a predetermined frequency bandwidth to the surface acoustic wave devices arranged in the respective regions, sending back frequency signals corresponding to temperatures of the respective regions within the bandwidth that is different for every region on the wafer, and receiving the frequency signal. Therefore the present invention enables automation, improvement of resistance to measure temperature of the plurality of regions on the upper surface of the wafer.

The foregoing has described the embodiments of the present invention by referring to the drawings. However the invention should not be limited to the illustrated embodiments. It should be appreciated that various modifications and changes can be made to the illustrated embodiments within the scope of the appended claims and their equivalents.

The temperature measuring device, thermal processor having a temperature measurement function and the temperature measurement method in the present invention are utilized to measure surface temperature of a cooling plate or heating plate in a heating/cooling system.

What is claimed is:

1. A temperature measuring device comprising:
   a wafer; and
   a plurality of temperature sensors arranged in regions formed by segmenting the upper surface of said wafer into a plurality of regions, each of said temperature sensors comprising:
   oscillation circuit for oscillating in response to receipt of a signal to output an oscillation frequency signal corresponding to a temperature of its own region, wherein said signal is power supply voltage; and
   wherein said oscillation circuit outputs an oscillation frequency signal corresponding to the temperature of its own region within a frequency band which is different for every region.

2. The temperature measuring device according to claim 1, wherein
   said oscillation circuit includes temperature dependent devices that change their characteristics depending on temperature, and thus changes its oscillation frequency with the characteristics changes of said temperature dependent devices.

3. The temperature measuring device according to claim 1, wherein
said oscillation circuit outputs an oscillation frequency signal corresponding to the temperature of its own region within a frequency band which is the same for every region.

4. The temperature measuring device according to claim 1, wherein said signal is a high-frequency signal and said oscillation circuit is a surface acoustic wave device for sending back a frequency signal corresponding to the temperature of its own region within a frequency bandwidth that is different for every region in response to input of the high frequency signal.

5. A temperature measuring device comprising:
a wafer-type temperature sensor including a wafer and a plurality of oscillation circuit, said oscillation circuit being arranged in regions formed by segmenting the upper surface of said wafer into a plurality of regions, and each of said oscillation circuit oscillating in response to receipt of power supply voltage to output an oscillation frequency signal corresponding to the temperature of its own region;
power supply unit for supplying power supply voltage to said oscillation circuit;
determination unit for determining the temperatures of the respective regions on said wafer based on the oscillation frequency signals oscillated by said plurality of oscillation circuit; and
communication unit for outputting the oscillation frequency signals oscillated by said oscillation circuit to said determination unit; and wherein
said plurality of oscillation circuit output oscillation frequency signals corresponding to the temperatures of their own regions within the respective frequency bands which are different for every region,
with reference to the oscillation frequency signals oscillated by the plurality of oscillation circuit, said determination unit determines each frequency band including the oscillation frequency signal to identify the region on the wafer corresponding to the frequency band, and determines the temperature of the region based on the oscillation frequency signal,
said communication unit outputs said oscillation frequency signals in the respective frequency bands by radio to the determination unit.

6. The temperature measuring device according to claim 5, wherein
said power supply unit generates microwave signals serving as said power supply voltage,
said communication unit comprises:
a communication antenna located at a distance away from said wafer-type temperature sensor;
transmitter circuit for transmitting said microwave signals generated by said power supply unit through said communication antenna; and
receiver circuit for receiving the oscillation frequency signals within said frequency bands oscillated by said oscillation circuit through said communication antenna.

7. The temperature measuring device according to claim 6, wherein
said wafer-type temperature sensor comprises:
transmitter circuit connected to the output of said oscillation circuit and for transmitting said oscillation frequency signals;
an element antenna connected to said transmitter circuit and for emitting said transmitted oscillation frequency signals by radio.

8. The temperature measuring device according to claim 5, wherein
said plurality of oscillation circuit output oscillation frequency signals corresponding to the temperature of their own regions within a frequency band that is the same for every region,
said communication unit outputs the oscillation frequency signals within said frequency band to said determination unit by wire.

* * * * *